(12) United States Patent
Otsubo et al.

(10) Patent No.: US 9,907,180 B2
(45) Date of Patent: Feb. 27, 2018

(54) MULTILAYER ELECTRONIC DEVICE AND MANUFACTURING METHOD THEREFOR

(71) Applicant: Murata Manufacturing Co., Ltd., Kyoto (JP)

(72) Inventors: Yoshihito Otsubo, Kyoto (JP); Nobuaki Ogawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 72 days.

(21) Appl. No.: 14/737,645

(22) Filed: Jun. 12, 2015

(65) Prior Publication Data

US 2015/0282327 A1 Oct. 1, 2015

Related U.S. Application Data

(63) Continuation of application No. PCT/JP2013/078052, filed on Oct. 16, 2013.

(30) Foreign Application Priority Data

Dec. 18, 2012 (JP) ................................ 2012-276076

(51) Int. Cl.
*H05K 1/11* (2006.01)
*H05K 1/18* (2006.01)
(Continued)

(52) U.S. Cl.
CPC ......... *H05K 1/183* (2013.01); *H01L 25/0657* (2013.01); *H05K 1/0298* (2013.01);
(Continued)

(58) Field of Classification Search
CPC ... H01L 2924/0002; H01L 2224/16225; H01L 2225/06517; H01L 2225/0652;
(Continued)

(56) References Cited

U.S. PATENT DOCUMENTS 5,994,166 A * 11/1999 Akram ................... H05K 1/144
                                                                257/686
6,777,787 B2 * 8/2004 Shibata ................... H01L 23/16
                                                                257/666
(Continued)

FOREIGN PATENT DOCUMENTS

JP    2000-012765 A    1/2000
JP    2000-174200 A    6/2000
(Continued)

OTHER PUBLICATIONS

English translation of Written Opinion of the International Search Authority for Application No. PCT/JP2013/078052 dated Jan. 7, 2014.
(Continued)

*Primary Examiner* — Pete Lee
(74) *Attorney, Agent, or Firm* — Pearne & Gordon LLP

(57) ABSTRACT

The present disclosure enhances the design flexibility of a multilayer electronic device. A multilayer electronic device is formed by alternately stacking, in a top-bottom direction, substrate layers in which substrates are disposed and a component layer in which at least one component is disposed. A non-superposing region in which a substrate of a first substrate layer positioned on the upper side of a first component layer is not superposed on a substrate of a second substrate layer positioned on the lower side of the first component layer, as viewed from above, is formed in the substrate. Accordingly, within the multilayer electronic device, a space in which the substrate of the second substrate layer is not located can be formed in a region under the non-superposing region of the substrate of the first substrate layer. By using this space, the design flexibility of the multilayer electronic device can be enhanced.

5 Claims, 5 Drawing Sheets

(51) Int. Cl.
*H01L 25/065* (2006.01)
*H05K 3/36* (2006.01)
*H05K 3/46* (2006.01)
*H05K 1/02* (2006.01)
*H05K 1/14* (2006.01)
*H01L 23/31* (2006.01)
*H01L 25/16* (2006.01)
*H05K 3/28* (2006.01)

(52) U.S. Cl.
CPC ............... *H05K 1/144* (2013.01); *H05K 3/36* (2013.01); *H05K 3/4614* (2013.01); *H01L 23/3121* (2013.01); *H01L 25/16* (2013.01); *H01L 2224/16225* (2013.01); *H01L 2225/0652* (2013.01); *H01L 2225/06517* (2013.01); *H01L 2225/06572* (2013.01); *H01L 2924/1531* (2013.01); *H01L 2924/19105* (2013.01); *H05K 3/284* (2013.01); *H05K 2201/042* (2013.01); *H05K 2201/10242* (2013.01); *H05K 2203/0156* (2013.01); *H05K 2203/1316* (2013.01); *H05K 2203/1327* (2013.01); *Y10T 29/49124* (2015.01)

(58) Field of Classification Search
CPC ....... H01L 2225/06572; H01L 23/3121; H01L 25/0657; H01L 25/16; H01L 2924/00; H01L 2924/1531; H01L 2924/19105; H01L 23/29; H05K 1/0298; H05K 1/144; H05K 1/183; H05K 3/36; H05K 3/4614; H05K 2201/042; H05K 2201/10242; H05K 2203/0156; H05K 2203/1316
See application file for complete search history.

(56) References Cited

U.S. PATENT DOCUMENTS

| | | | | |
|---|---|---|---|---|
| 6,939,738 | B2 * | 9/2005 | Nakatani | H01L 21/4857 257/686 |
| 7,294,928 | B2 * | 11/2007 | Bang | H01L 23/49816 257/685 |
| 8,148,806 | B2 * | 4/2012 | Lin | H01L 25/0657 257/202 |
| 8,461,463 | B2 * | 6/2013 | Kato | H01L 23/645 174/258 |
| 9,059,009 | B2 * | 6/2015 | Horio | H01L 25/18 |
| 9,355,962 | B2 * | 5/2016 | Lee | H01L 21/56 |
| 2006/0087020 | A1 * | 4/2006 | Hirano | H01L 23/5389 257/686 |

FOREIGN PATENT DOCUMENTS

| | | | |
|---|---|---|---|
| JP | 2000174200 | A * | 6/2000 |
| JP | 2006-120935 | A | 5/2006 |
| JP | 2008-311267 | A | 12/2008 |
| JP | 2012-129336 | A | 7/2012 |

OTHER PUBLICATIONS

Office Action issued in JP2014-552975 dated Sep. 1, 2015.

* cited by examiner

PRIOR ART

MULTILAYER ELECTRONIC DEVICE AND MANUFACTURING METHOD THEREFOR

FIELD OF THE DISCLOSURE

The present disclosure relates to a multilayer electronic device formed by alternately stacking substrate layers in which substrates are disposed and component layers in which components are disposed on each other, and to a manufacturing method for the multilayer electronic device.

DESCRIPTION OF THE RELATED ART

In accordance with a reduced size of recent electronic apparatuses, it is also desirable to reduce the size of an electronic device mounted on such an electronic apparatus. Hitherto, as shown in FIG. 6, a multilayer electronic device formed by alternately stacking wiring substrates on which wiring patterns are formed and component layers in which components are disposed on each other has been proposed (see Patent Document 1).

This multilayer electronic device 100 includes a plurality of substrate layers 101 and a plurality of component layers 102 forming an electric circuit. Each of the substrate layers 101 includes a wiring substrate on which a wiring pattern is formed. Each of the component layers 102 includes a semiconductor element 103 sealed by a thermosetting resin component 104. Under these substrate layers 101 and the component layers 102, a substrate layer 101 on which external connection terminals 105 are formed is disposed and is used as the bottommost layer. The substrate layers 101 and the component layers 102 are alternately stacked on each other in the top-bottom direction.

In this case, the semiconductor element 103 disposed in each component layer 102 is mounted on one principal surface of each of wiring substrates disposed on the upper and lower sides of the component layer 102. In each component layer 102, interlayer connecting conductors 106 for connecting the wiring substrates disposed on the upper and lower sides of the component layer 102 are formed. With this configuration, an electric circuit having a three-dimensional wiring structure is formed by the wiring substrate of each substrate layer 101, the semiconductor element 103 of each component layer 102, and the interlayer connecting conductors 106. Accordingly, compared with a known multilayer electronic device in which a two-dimensional electric circuit is formed by disposing components, such as semiconductor elements, on a wiring substrate having a single layer, the area of the principal surfaces of the wiring substrates of the substrate layers 101 can be reduced. It is thus possible to reduce the size of the multilayer electronic device 100.

Patent Document 1: Japanese Unexamined Patent Application Publication No. 2006-120935 (see paragraphs 0023, 0117, and 0118, and FIG. 16)

BRIEF SUMMARY OF THE DISCLOSURE

Concerning an electronic device mounted on a recent electronic apparatus, it is also desirable to reduce the thickness of the electronic device in the stacking direction, as well as to reduce the area, such as that of the principal surfaces of the wiring substrates of the substrate layers 101 described above. However, in the multilayer electronic device 100 disclosed in Patent Document 1, on both of the upper and lower sides of each component layer 102, the wiring substrates of substrate layers 101 are disposed. Accordingly, it is not possible to decrease the distance between the wiring substrates 101 disposed on the upper and lower sides of the component layer 102 to be smaller than the height of the semiconductor element 103 disposed in this component layer 102.

A ground electrode may be formed in the wiring substrate 101 positioned on the upper side of one component layer 102. In this case, however, if the distance between the wiring substrates of the substrate layers 101 positioned on the upper and lower sides of the component layer 102 is decreased, stray capacitance between the ground electrode and the semiconductor element 103 disposed in the component layer 102 is increased, or stray capacitance between the ground electrode and the wiring pattern formed on the wiring substrate of the substrate layer 101 positioned on the lower side of this component layer 102 is increased. In this case, it is necessary to intentionally increase the distance between the substrate layers 101 on the upper and lower sides of the component layer 102. In this manner, there are many design limitations in reducing the thickness of the known multilayer electronic device 100.

If it is desired that a wiring pattern formed on the topmost wiring substrate 101 be connected to an external connection terminal 105 formed on the bottommost wiring substrate 101, it is not possible to directly connect the wiring pattern to the external connection terminal 105 by using a single interlayer connecting conductor 106. Instead, the wiring pattern and the external connection terminal 105 have to be connected to each other with the use of wiring patterns and via-conductors formed on or in the wiring substrates of the substrate layers 101 positioned between the topmost and bottommost wiring substrates 101. This increases stray inductance.

The present disclosure has been made in view of the above-described problems. It is a first object of the present disclosure to enhance the design flexibility of a multilayer electronic device. It is a second object of the present disclosure to reduce the thickness of a multilayer electronic device.

In order to achieve the above-described objects, the present disclosure provides a multilayer electronic device formed by alternately stacking substrate layers and a component layer in a top-bottom direction, a substrate being disposed in each of the substrate layers and at least one component being disposed in the component layer. A non-superposing region is formed in a substrate of an upper substrate layer, which is a substrate layer positioned on an upper side of the component layer, and/or a substrate of a lower substrate layer, which is a substrate layer positioned on a lower side of the component layer, and in the non-superposing region, the substrate of the upper substrate layer and the substrate of the lower substrate layer are not superposed on each other, as viewed from above.

With this configuration, a non-superposing region in which the substrate of the upper substrate layer and the substrate of the lower substrate layer are not superposed on each other, as viewed from above, is formed in at least one of the substrate of the upper substrate layer and the substrate of the lower substrate layer. For example, if a non-superposing region is formed in the substrate of the lower substrate layer, the substrate (substrate of the upper substrate layer) is not disposed in a region of the upper substrate layer corresponding to this non-superposing region. Accordingly, a designing-required space can be secured above this non-superposing region. That is, a component having a height greater than the distance between the upper and lower substrate layers can be disposed in the component layer without changing this distance. Also, the substrate of the lower substrate layer and the substrate of a substrate layer immediately above the upper substrate layer can be directly connected to each other by an interlayer connecting conductor without the interposed upper substrate layer therebetween. Thus, the design flexibility of the multilayer electronic device can be enhanced, thereby achieving the first object of the present disclosure.

An area of one of the substrate of the upper substrate layer and the substrate of the lower substrate layer may be smaller than an area of the other one of the substrate of the upper substrate layer and the substrate of the lower substrate layer, as viewed from above. In this manner, by forming the area of one of the substrate of the upper substrate layer and the substrate of the lower substrate layer to be smaller than that of the other one of the substrate of the upper substrate layer and the substrate of the lower substrate layer, as viewed from above, it is possible to form a non-superposing region for securing a designing-required space in the substrate of the other one of the substrate of the upper substrate layer and the substrate of the lower substrate layer.

The component layer may include at least one of the components which is disposed at a position corresponding to the non-superposing region. A height of the at least one of the components in a stacking direction may be greater than a distance between opposing principal surfaces of the substrate of the upper substrate layer and the substrate of the lower substrate layer. With this configuration, even if a component having a height greater than the distance between the opposing principal surfaces of the substrate of the upper substrate layer and the substrate of the lower substrate layer is disposed in the component layer, it is not necessary to increase the distance between the upper substrate layer and the lower substrate layer in accordance with the height of the component. Thus, the thickness of the multilayer electronic device can be reduced, thereby achieving the second object of the present disclosure.

The component layer may include at least one of the components which is disposed at a position corresponding to a superposing region in which the substrate of the upper substrate layer and the substrate of the lower substrate layer are superposed on each other, as viewed from above. With this configuration, a component may also be disposed in the component layer at a position corresponding to the superposing region. It is thus possible to implement high-density mounting of components.

The at least one of the components disposed at a position corresponding to the superposing region may be an IC. The IC may be mounted on one of the substrate of the upper substrate layer and the substrate of the lower substrate layer. A surface of the IC opposite a mounting surface of the IC mounted on one of the substrate of the upper substrate layer and the substrate of the lower substrate layer may be in contact with the other one of the substrate of the upper substrate layer and the substrate of the lower substrate layer. With this configuration, even if the heat generation of the IC is high, the generated heat is conducted to, for example, a wiring electrode, formed in the other one of the substrate of the upper substrate layer and the substrate of the lower substrate layer and is dissipated, thereby enhancing the heat dissipation of the IC.

A plurality of interlayer-connecting columnar conductors connected to one of the substrate of the upper substrate layer and the substrate of the lower substrate layer may further be provided. The plurality of interlayer-connecting columnar conductors may be disposed so as to enclose the at least one component of the component layer. By disposing the columnar conductors in this manner, the columnar conductors may be used as shield members for shielding the IC or a chip component from unwanted electromagnetic waves entering from the outside.

The substrate of the upper substrate layer, the substrate of the lower substrate layer, the at least one component, and the interlayer-connecting columnar conductors may be sealed by a resin. The non-superposing region may be formed in the substrate of one of the upper substrate layer and the lower substrate layer. At least one of the plurality of interlayer-connecting columnar conductors may be disposed at a position corresponding to the non-superposing region of the substrate of one of the upper substrate layer and the lower substrate layer, and one end portion of the at least one of the plurality of interlayer-connecting columnar conductors may be connected to the substrate of one of the upper substrate layer and the lower substrate layer in which the non-superposing region is formed, while the other end portion of the at least one of the plurality of interlayer-connecting columnar conductors may be exposed to the outside from a surface of the resin.

The other end portions of the columnar conductors are exposed to the outside from the surface of the resin, and can thus be used as external connection terminals for connecting the multilayer electronic device with, for example, an external mother board. These columnar conductors are arranged such that one end portion of each of the columnar conductors is connected to the non-superposing region of the substrate of one of the upper substrate layer and the lower substrate layer, while the other end portions thereof are exposed to the outside from the surface of the resin, instead of being connected to the substrate of the other one of the upper substrate layer and the lower substrate layer. Thus, unlike a case in which the other end portions of the columnar conductors are extended to the surface of the resin with interposed wiring patterns and via-conductors formed in the substrate of the other one of the upper substrate layer and the lower substrate layer, it is possible to prevent the generation of the contact resistance at a connecting portion with the substrate of the other one of the upper substrate layer and the lower substrate layer and to suppress an increase in stray inductance which would otherwise be caused by an increased extended path.

A principal surface of the substrate of the other one of the upper substrate layer and the lower substrate layer opposite a principal surface of the substrate which opposes the substrate of one of the upper substrate layer and the lower substrate layer having the substrate in which the non-superposing region is formed may be exposed to the outside from the surface of the resin. An external connection terminal may be provided on the exposed principal surface. With this configuration, the multilayer electronic device can be connected to an external component by using both of the columnar conductors, the other end portions of which are exposed to the outside from the surface of the resin, and the connection terminal provided on the substrate of the other one of the upper substrate layer and the lower substrate layer. The connection terminal formed on the substrate is not likely to be vulnerable to the influence of thermal expansion and contraction of the resin, thereby enhancing the reliability in connecting to an external component.

A manufacturing method for a multilayer electronic device according to the present disclosure includes: a first preparing step of preparing a first member including a first substrate and a plurality of first columnar conductors, one end portion of each of the plurality of first columnar conductors being connected to one of principal surfaces of the first substrate, the plurality of first columnar conductors being disposed so as to enclose a predetermined region of the principal surface of the first substrate to which one end portion of each of the plurality of first columnar conductors is connected; a second preparing step of preparing a second member including a second substrate and a plurality of second columnar conductors, an area of a principal surface of the second substrate being smaller than an area of the principal surface of the first substrate, one end portion of each of the plurality of second columnar conductors being connected to one of principal surfaces of the second substrate, the plurality of second columnar conductors being disposed so as to enclose a component to be mounted on one of the principal surfaces of the second substrate; a disposing step of disposing the second member within an enclosed region formed by the plurality of first columnar conductors; and a resin sealing step of sealing the first member and the second member with a resin.

With this configuration, a non-superposing region in which the first substrate is not superposed on the second substrate, as viewed from above, can be easily formed in the first substrate. It is thus possible to easily manufacture a multilayer electronic device in which a designing-required space can be secured.

One end portion of each of the first columnar conductors is connected to one of principal surfaces of the first substrate, and the first columnar conductors are disposed so as to enclose a predetermined region of the principal surface of the first substrate to which one end portion of each of the first columnar conductors is connected. In this enclosed region formed by the first columnar conductors, the second member is disposed. Accordingly, the other end portions of the first columnar conductors are not connected to the second substrate of the second member. It is thus possible to manufacture a multilayer electronic device in which the first substrate can be directly connected to, for example, an external mother board, by using the first columnar conductors without interposed wiring patterns and via-conductors formed in the second substrate therebetween.

The component mounted on the second substrate is enclosed by the second columnar conductors. It is thus possible to manufacture a multilayer electronic device having high shielding characteristics for shielding components.

In the disposing step, the second member may be disposed such that the other principal surface of the second substrate opposes the principal surface of the first substrate to which one end portion of each of the plurality of first columnar conductors is connected. With this configuration, it is possible to manufacture a multilayer electronic device in which, by connecting the other end portions of the first and second columnar conductors to an external component, the first and second columnar conductors can be used as external connection conductors.

In the disposing step, the second member may be disposed such that the principal surface of the first substrate to which one end portion of each of the plurality of first columnar conductors is connected opposes the principal surface of the second substrate to which one end portion of each of the plurality of second columnar conductors is connected, and the other end portions of the plurality of second columnar conductors may be connected to the principal surface of the first substrate to which one end portion of each of the plurality of first columnar conductors is connected. With this configuration, it is possible to manufacture a multilayer electronic device in which the first columnar conductors can be used as external connection conductors and the second columnar conductors can serve as connection conductors for connecting the first substrate and the second substrate.

According to the present disclosure, a non-superposing region in which the substrate of the upper substrate layer and the substrate of the lower substrate layer are not superposed on each other, as viewed from above, is formed in at least one of the substrate of the upper substrate layer and the substrate of the lower substrate layer. For example, if a non-superposing region is formed in the substrate of the lower substrate layer, the substrate (substrate of the upper substrate layer) is not disposed in a region of the upper substrate layer corresponding to this non-superposing region. Accordingly, a designing-required space can be secured above this non-superposing region, thereby enhancing the design flexibility of the multilayer electronic device.

BRIEF DESCRIPTION OF THE SEVERAL VIEWS OF THE DRAWINGS

FIGS. 4(a)-4(f) show views illustrating a manufacturing method of the multilayer electronic device shown in FIG. 3.

DETAILED DESCRIPTION OF THE DISCLOSURE

[First Embodiment]

Figure 1:
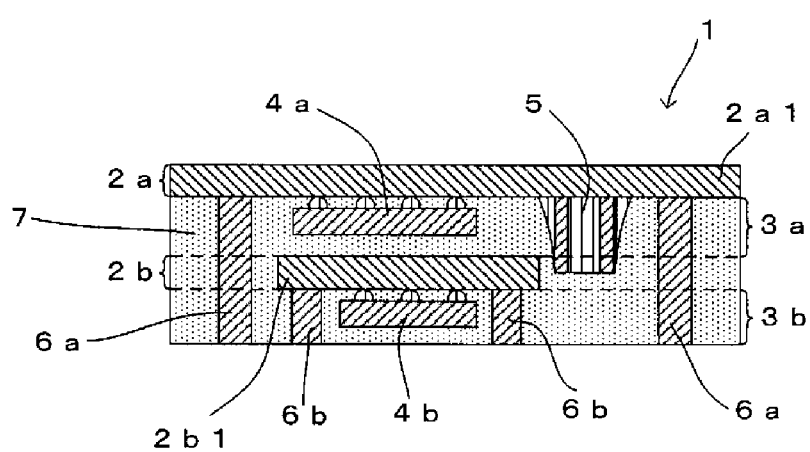
FIG. 1 is a sectional view of a multilayer electronic device according to a first embodiment of the present disclosure.

The configuration of a multilayer electronic device according to a first embodiment of the present disclosure will be described below with reference to FIG. 1. FIG. 1 is a sectional view of the multilayer electronic device according to the first embodiment.

A multilayer electronic device 1 according to this embodiment is formed by alternately stacking, in the top-bottom direction, substrate layers each in which a substrate is disposed and component layers each in which at least one component is disposed. The multilayer electronic device 1 is disposed on, for example, a mother board of an electronic apparatus, so as to form part of an electric circuit formed in the electronic apparatus.

More specifically, the multilayer electronic device 1 includes a first substrate layer 2a (corresponding to an "upper substrate layer" in the present disclosure), a first component layer 3a (corresponding to the "component layer" in the present disclosure), a second substrate layer 2b (corresponding to a "lower substrate layer" in the present disclosure), and a second component layer 3b. In the first substrate layer 2a, a substrate 2a1 is disposed. In the first component layer 3a, an IC 4a, which is a semiconductor element made of, for example, Si or GaAs, and a chip component 5, such as a chip capacitor or a chip inductor, are disposed as components. In the second substrate layer 2b, a substrate 2b1 is disposed. In the second component layer 3b, an IC 4b is disposed as a component. Hereinafter, the substrate 2a1 of the first substrate layer 2a may also be referred to as a "first substrate 2a1", and the substrate 2b1 of the second substrate layer 2b may also be referred to as a "second substrate 2b1".

In addition to the above-described configuration, the multilayer electronic device 1 includes a plurality of first columnar conductors 6a, a plurality of second columnar conductors 6b, and a resin 7. One end portion of each of the plurality of first columnar conductors 6a is connected to the lower principal surface (corresponding to "one principal surface of the first substrate" in the present disclosure) of the substrate 2a1 of the first substrate layer 2a. One end portion of each of the plurality of second columnar conductors 6b is connected to the lower principal surface (corresponding to "one principal surface of the second substrate" in the present disclosure) of the substrate 2b1 of the second substrate layer 2b. The resin 7 seals the ICs 4a and 4b, the chip component 5, the substrate 2b1 of the second substrate layer 2b, and the columnar conductors 6a and 6b positioned under the substrate 2a1 of the first substrate layer 2a.

The substrate 2a1 of the first substrate layer 2a and the substrate 2b1 of the second substrate layer 2b may be made of, for example, glass epoxy resin, glass, or ceramics. Wiring patterns are formed on both principal surfaces of the substrates 2a1 and 2b1, and via-conductors, for example, are formed within the substrates 2a1 and 2b1. The area of the substrate 2b1 of the second substrate layer 2b is smaller than that of the substrate 2a1 of the first substrate layer 2a, as viewed from above. In the state in which the layers 2a, 2b, 3a, and 3b are stacked on each other, a region in which the substrate 2a1 of the first substrate layer 2a is not superposed on the substrate 2b1 of the second substrate layer 2b (such a region will be referred to as "non-superposing region") is formed in the substrate 2a1, as viewed from above. Alternatively, the area of the substrate 2a1 of the first substrate layer 2a may be smaller than that of the substrate 2b1 of the second substrate layer 2b, as viewed from above, and a non-superposing region may be formed in the substrate 2b1 of the second substrate layer 2b, as viewed from above. Alternatively, the substrate 2a1 of the first substrate layer 2a and the substrate 2b1 of the second substrate layer 2b may be formed so that the substrates 2a1 and 2b1 have the same area, as viewed from above, and the substrates 2a1 and 2b1 may be displaced from each other in a direction perpendicular to the stacking direction, thereby forming a non-superposing region in each of the substrates 2a1 and 2b1.

The IC 4a and the chip component 5 disposed in the first component layer 3a are mounted on the lower principal surface of the substrate 2a1 of the first substrate layer 2a, and the IC 4b disposed in the second component layer 3b is mounted on the lower principal surface of the substrate 2b1 of the second substrate layer 2b. The mounting of these components 4a, 4b, and 5 is performed by a known surface mount technology. In this configuration, the height of the chip component 5 mounted in the first component layer 3a is greater than the distance between the lower principal surface of the substrate 2a1 of the first substrate layer 2a and the upper principal surface of the substrate 2b1 of the second substrate layer 2b, that is, the distance between the opposing principal surfaces of the substrates 2a1 and 2b1. However, the chip component 5 is disposed at a position corresponding to the non-superposing region of the substrate 2a1 of the first substrate layer 2a, and thus, it does not interfere with the substrate 2b1 of the second substrate layer 2b.

The first columnar conductors 6a are pin-shaped conductors formed by working wire rods made of, for example, Cu. One end portion of each of the first columnar conductors 6a is connected to the non-superposing region of the lower principal surface of the substrate 2a1 of the first substrate layer 2a, and the first columnar conductors 6a are arranged so as to enclose the IC 4a and the chip component 5 disposed in the first component layer 3a. The other end portions of the first columnar conductors 6a are exposed to the outside from the surface of the resin 7. The first columnar conductors 6a may not have to be arranged so as to enclose the components 4a and 5, and instead, they may be disposed at any position as long as one end portion of each of the first columnar conductors 6a is connected to the non-superposing region of the substrate 2a1 of the first substrate layer 2a.

The second columnar conductors 6b are pin-shaped conductors formed by working wire rods made of, for example, Cu. One end portion of each of the second columnar conductors 6b is connected to the lower principal surface of the substrate 2b1 of the second substrate layer 2b, and the second columnar conductors 6b are arranged so as to enclose the IC 4b disposed in the second component layer 3b. The other end portions of the second columnar conductors 6b are exposed to the outside from the surface of the resin 7. The second columnar conductors 6b may not have to be arranged so as to enclose the IC 4b disposed in the second component layer 3b. The columnar conductors 6a and 6b may be post electrodes or via-conductors formed by charging a conductive paste into via-holes.

The lengths of the first and second columnar conductors 6a and 6b may be adjusted so that the surface of the IC 4a opposite the mounting surface to be mounted on the substrate 2a1 of the first substrate layer 2a will be in contact with the other principal surface of the substrate 2b1 of the second substrate layer 2b (the surface opposite the principal surface of the substrate 2b1 to which one end portion of each of the IC 4b and the second columnar conductors 6b is connected). With this configuration, heat generated from the IC 4a mounted on the substrate 2a1 of the first substrate layer 2a is conducted and dissipated through, for example, a wiring pattern formed on the substrate 2b1 of the second substrate layer 2b. Thus, heat dissipation of the IC 4a mounted on the substrate 2a1 of the first substrate layer 2a is improved.

The resin 7 seals the ICs 4a and 4b, the chip component 5, the substrate 2b1 of the second substrate layer 2b, and the columnar conductors 6a and 6b positioned under the substrate 2a1 of the first substrate layer 2a, and is made of, for example, epoxy resin.

A manufacturing method for the multilayer electronic device 1 will now be described below with reference to FIGS. 2(a)-2(f). FIGS. 2(a)-2(f) shows views illustrating a manufacturing method of the multilayer electronic device 1, and indicate individual steps of the manufacturing method.

Figure 2A:
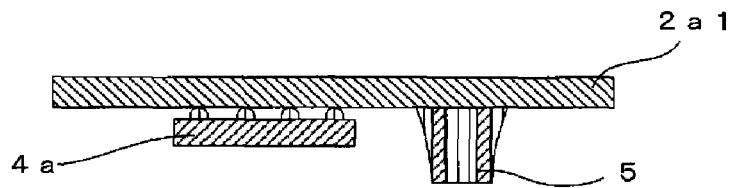
FIGS. 2(a)-2(f) show views illustrating a manufacturing method of the multilayer electronic device shown in FIG. 1.

First, as shown in FIG. 2(a), by using a known surface mount technology, the IC 4a and the chip component 5 are mounted on one principal surface (lower principal surface) of the first substrate 2a1 on which a wiring pattern is disposed and in which a via-conductor is disposed.

Figure 2B:
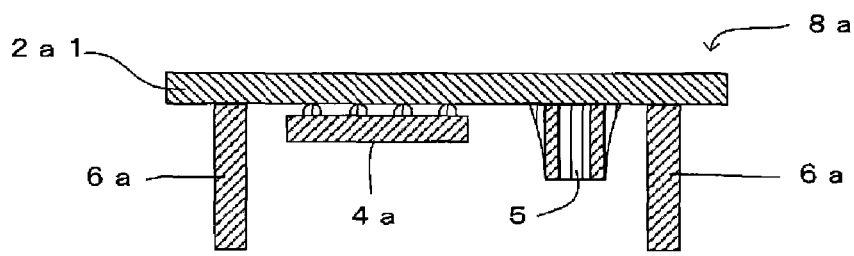

Then, as shown in FIG. 2(b), the plurality of first columnar conductors 6a are arranged so as to enclose a predetermined region of the lower principal surface of the first substrate 2a1, that is, to enclose the mounted IC 4a and chip component 5, and one end portion of each of the first columnar conductors 6a is connected to the lower principal surface of the first substrate 2a1. As a result, a first member 8a including the first substrate 2a1, the IC 4a, the chip component 5, and the first columnar conductors 6a is prepared (first preparing step). At this time, an enclosed region in which a second member 8b, which will be discussed below, will be disposed is formed by the first columnar conductors 6a. The order in which the IC 4a and the chip component 5 are mounted and in which the first columnar conductors 6a are connected to the substrate 2a1 may be reversed. That is, the first member 8a may be prepared by mounting the IC 4a and the chip component 5 on the first substrate 2a1 having the first columnar conductors 6a thereon.

Figure 2C:
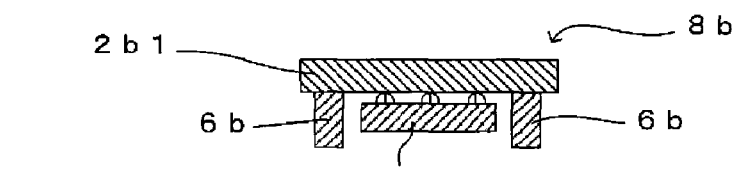

Then, as shown in FIG. 2(c), the IC 4b is mounted on one principal surface (lower principal surface) of the second substrate 2b1, the area of the principal surface of which is smaller than that of the first substrate 2a1. Then, the plurality of second columnar conductors 6b are arranged so as to enclose the mounted IC 4b, and one end portion of each of the second columnar conductors 6b is connected to the lower principal surface of the second substrate 2b1. As a result, the second member 8b including the second substrate 2b1, the IC 4b, and the second columnar conductors 6b is prepared (second preparing step). In this case, too, the order in which the IC 4b is mounted and in which the second columnar conductors 6b are connected to the second substrate 2b1 may be reversed.

Figure 2D:
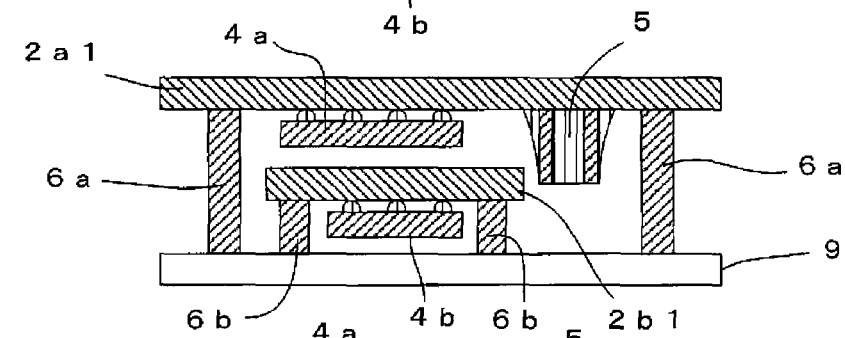

Then, as shown in FIG. 2(d), the other end portions of the second columnar conductors 6b of the second member 8b are bonded to one principal surface (upper principal surface) of a support member 9 to which an adhesive sheet (not shown), for example, is attached. Also, the first member 8a is disposed so that the second member 8b may be disposed within the enclosed region formed by the first columnar conductors 6a of the first member 8a, and then, the other end portions of the first columnar conductors 6a are bonded to the upper principal surface of the support member 9 (disposing step). In this case, the first member 8a and the second member 8b are disposed at positions at which the chip component 5 having a height greater than the distance between the opposing principal surfaces of the first and second substrates 2a1 and 2b1 does not interfere with the second substrate 2b1. With this arrangement, a non-superposing region in which the first substrate 2a1 is not superposed on the second substrate 2b1, as viewed from above, is formed in the first substrate 2a1. The first columnar conductors 6a and the chip component 5 of the first member 8a are disposed at positions corresponding to this non-superposing region.

Figure 2E:
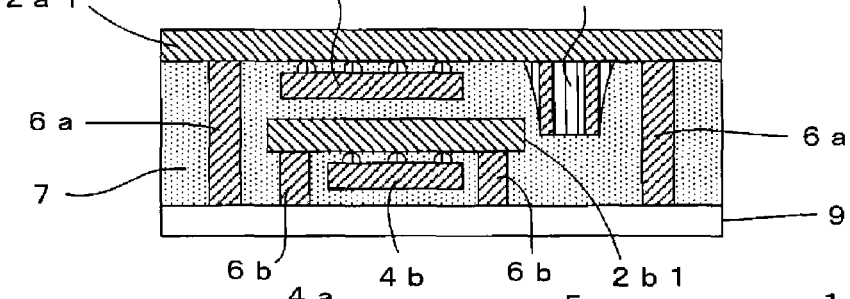

Then, as shown in FIG. 2(e), a resin is charged between the lower principal surface of the first substrate 2a1 and the upper principal surface of the support member 9, and is set at a temperature of about 180° C. As a result, the IC 4a, the chip component 5, and the first columnar conductors 6a mounted on the first substrate 2a1 of the first member 8a and the second member 8b are sealed by the resin.

Figure 2F:
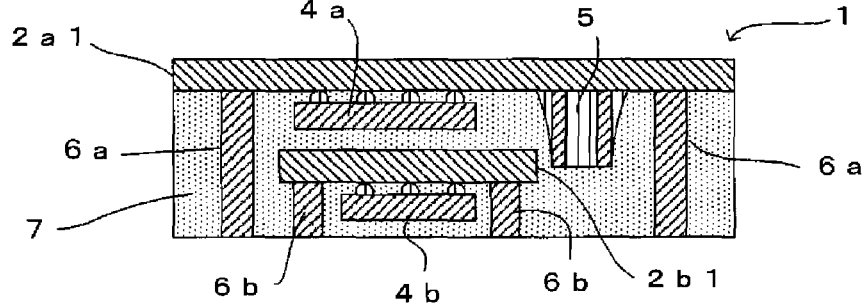

Finally, as shown in FIG. 2(f), by removing the support member 9, the multilayer electronic device 1 is manufactured. In this state, the other end portions of the first columnar conductors 6a and the second columnar conductors 6b are exposed to the outside from the surface of the resin. In this case, by polishing or grinding the boundary surface between the support member 9 and the resin 7, the lengths of the first columnar conductors 6a and the second columnar conductors 6b may be adjusted so that the other ends thereof can be reliably exposed.

In the above-described embodiment, in the substrate 2a1 of the first substrate layer 2a, a non-superposing region in which the substrate 2a1 is not superposed on the substrate 2b1 of the second substrate layer 2b, as viewed from above, is formed. Accordingly, under the non-superposing region of the substrate 2a1 of the first substrate layer 2a, a space free from the interference of the substrate 2b1 of the second substrate layer 2b can be secured. Thus, the chip component 5 having a great height can be disposed within this space without changing the distance between the substrate 2a1 of the first substrate layer 2a and the substrate 2b1 of the second substrate layer 2b. Also, the first columnar conductors 6a can be directly connected to an external component without the interposed substrate 2b1 of the second substrate layer 2b therebetween. As a result, the design flexibility of the multilayer electronic device 1 can be enhanced.

By forming the area of the substrate 2b1 of the second substrate layer 2b to be smaller than that of the substrate 2a1 of the first substrate layer 2a, as viewed from above, it is possible to easily form a non-superposing region in the substrate 2a1 of the first substrate layer 2a.

The chip component 5 of the first component layer 3a, which has a height greater than the distance between the opposing principal surfaces of the substrate 2a1 of the first substrate layer 2a and the substrate 2b1 of the second substrate layer 2b, is disposed in the first component layer at a position 3a corresponding to the non-superposing region of the substrate 2a1 of the first substrate layer 2a. Accordingly, it is not necessary to increase the distance between the opposing principal surfaces of the substrate 2a1 of the first substrate layer 2a and the substrate 2b1 of the second substrate layer 2b in accordance with the height of the chip component 5. Thus, the thickness of the multilayer electronic device 1 can be reduced to be smaller than a known multilayer electronic device without a non-superposing region in which substrates of substrate layers disposed on the upper and lower sides of one component layer are not superposed on each other, as viewed from above.

Additionally, a ground electrode may be disposed at a position corresponding to such a non-superposing region of the substrate 2a1 of the first substrate layer 2a. In this case, even with a decreased distance between the substrate 2a1 of the first substrate layer 2a and the substrate 2b1 of the second substrate layer 2b, it is still possible to decrease stray capacitance between this ground electrode and the IC 4a disposed in the first component layer 3a at a position corresponding to a superposing region in which the substrate 2a1 of the first substrate layer 2a is superposed on the substrate 2b1 of the second substrate layer 2b and stray capacitance between this ground electrode and wiring patterns formed on the substrate 2b1 of the second substrate layer 2b. Thus, the thickness of the multilayer electronic device 1 can be reduced to be smaller than a known multilayer electronic device in which, for avoiding the influence of such stray capacitance, substrate layers on the upper and lower sides of a component layer have to be separated from each other by a predetermined distance.

The IC 4a is disposed in the first component layer 3a at a position corresponding to the superposing region in which the substrate 2a1 of the first substrate layer 2a and the substrate 2b1 of the second substrate layer 2b are superposed on each other, as viewed from above, and also, the IC 4b is also disposed in the second component layer 3b at a position corresponding to this superposing region. It is thus possible to implement high-density mounting of the components 4 and 5.

The first columnar conductors 6a are arranged so as to enclose the IC 4a and the chip component 5 disposed in the first component layer 3a, while the second columnar conductors are arranged so as to enclose the IC 4b disposed in the second component layer 3b. Accordingly, the first columnar conductors 6a and the second columnar conductors 6b may be used as shield members for shielding the ICs 4a and 4b and the chip component 5 from unwanted electromagnetic waves entering from the outside.

The other end portions of the first and second columnar conductors 6a and 6b are exposed to the outside from the surface of the resin 7, and thus, the first and second columnar conductors 6a and 6b can be used as external connection conductors. The first columnar conductors 6a, which are each a single conductor made of the same material, are directly extended to the surface of the resin 7 without interposed wiring patterns disposed on or via-conductors disposed in the substrate 2b1 of the second substrate layer 2b therebetween. This makes it possible to prevent the generation of the contact resistance with the substrate 2b1 of the second substrate layer 2b and to suppress an increase in stray inductance which would otherwise be caused by an increased extended path.

According to the manufacturing method discussed with reference to FIGS. 2(a)-2(f), the multilayer electronic device 1 can be manufactured in the following manner. The first member 8a having the IC 4a, the chip component 5, and the first columnar conductors 6a mounted thereon by using a known surface mount technology and the second member 8b having the IC 4b and the second columnar conductors 6 mounted thereon by using a known surface mount technology are located at predetermined positions and are then bonded to the support member 9. It is thus possible to easily manufacture the multilayer electronic device 1 in which a designing-required space can be secured, by the provision of a non-superposing region in which the first substrate 2a1 (substrate 2a1 of the first substrate layer 2a) is not superposed on the second substrate 2b1 (substrate 2b1 of the second substrate layer 2b) in the first substrate 2a1, as viewed from above.

The first member 8a and the second member 8b are disposed such that the chip component 5 having a thickness greater than the distance between the opposing principal surfaces of the first substrate 2a1 and the second substrate 2b1 does not interfere with the second substrate 2b1 of the second member 8b. Accordingly, it is not necessary to increase the distance between the opposing principal surfaces of the first substrate 2a1 of the first member 8a and the second substrate 2b1 of the second member 8b in accordance with the height of the chip component 5. As a result, the multilayer electronic device 1 having a reduced thickness can be manufactured.

The second member 8b is disposed within the enclosed region formed by the first columnar conductors 6a. Accordingly, the first columnar conductors 6a, which are each a single conductor made of the same material, can be directly extended to the surface of the resin 7 without interposed wiring patterns disposed on or via-conductors disposed in the second substrate 2b1 therebetween. It is thus possible to manufacture the multilayer electronic device 1 in which the generation of the contact resistance with the second substrate 2b1 can be prevented and in which an increase in stray inductance caused by an increased extended path can be suppressed.

The first columnar conductors 6a are arranged so as to enclose the IC 4a of the first member 8a, while the second columnar conductors 6b are arranged so as to enclose the IC 4b of the second member 8b. It is thus possible to manufacture the multilayer electronic device 1 having high shielding characteristics for shielding the ICs 4a and 4b.

[Second Embodiment]

Figure 3:
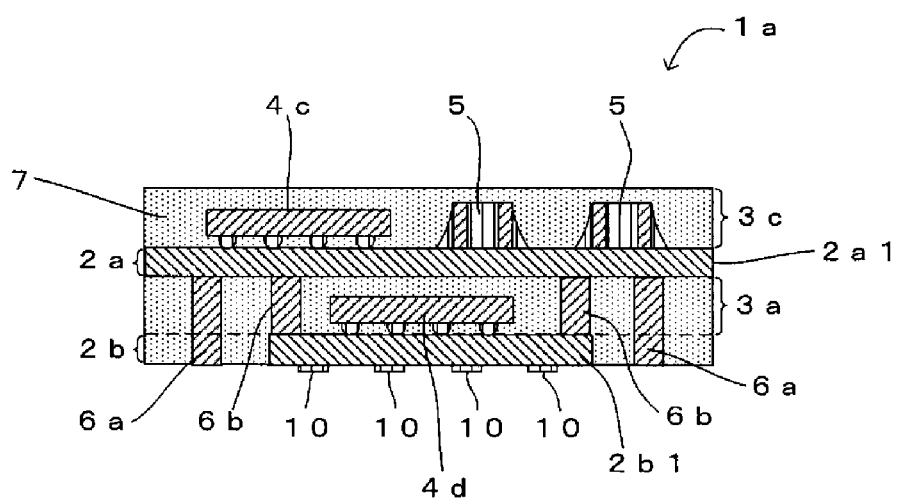
FIG. 3 is a sectional view of a multilayer electronic device according to a second embodiment of the present disclosure.

A multilayer electronic device 1a according to a second embodiment of the present disclosure will be described below with reference to FIG. 3. FIG. 3 is a sectional view of the multilayer electronic device 1a.

The multilayer electronic device 1a according to this embodiment is different from the multilayer electronic device 1 of the first embodiment discussed with reference to FIG. 1 in the following points. As shown in FIG. 3, instead of the second component layer 3b, a third component layer 3c is stacked on the upper side of the first substrate layer 2a. The second columnar conductors 6b are disposed in the first component layer 3a. The lower principal surface of the substrate 2b1 of the second substrate layer 2b is exposed to the outside from the surface of the resin 7. The other configurations are the same as those of the first embodiment. Accordingly, the same configurations will be designated by like reference numerals, and an explanation thereof will thus be omitted.

In the third component layer 3c, an IC 4c and two chip components 5 are disposed and are sealed by a resin 7. The IC 4c and the two chip components 5 are mounted on the substrate 2a1 of the first substrate layer 2a by using a known surface mount technology.

In the first component layer 3a, an IC 4d mounted on the substrate 2b1 of the second substrate 2b is disposed. One end portion of each of the second columnar conductors 6b disposed in the first component layer 3a is connected to the substrate 2b1 of the second substrate layer 2b, and the other ends thereof are connected to the substrate 2a1 of the first substrate layer 2a.

The principal surface of the substrate 2b1 of the second substrate layer 2b opposite the principal surface on which the IC 4d of the first component layer 3a is mounted is exposed to the outside from the surface of the resin 7, and a plurality of external connection terminals 10 are provided on the exposed principal surface. The connection terminals 10 are formed by a printing technology or by plating using a conductive paste made of, for example, Ag.

As in the multilayer electronic device 1 of the first embodiment, one end portion of each of the first columnar conductors 6a is connected to the non-superposing region of the substrate 2a1 of the first substrate layer 2a, and the other end portions thereof are exposed to the outside from the surface of the resin 7.

By adjusting the lengths of the second columnar conductors 6b, the surface of the IC 4d disposed in the first component layer 3a opposite the mounting surface may be in contact with the lower principal surface of the substrate 2a1 of the first substrate layer 2a. With this configuration, heat dissipation of the IC 4d disposed in the first component layer 3a is enhanced.

A manufacturing method for the multilayer electronic device 1a according to this embodiment will now be described below with reference to FIGS. 4(a)-4(f). FIGS. 4(a)-4(f) show views illustrating a manufacturing method of the multilayer electronic device 1a, and indicate individual steps of the manufacturing method.

Figure 4A:
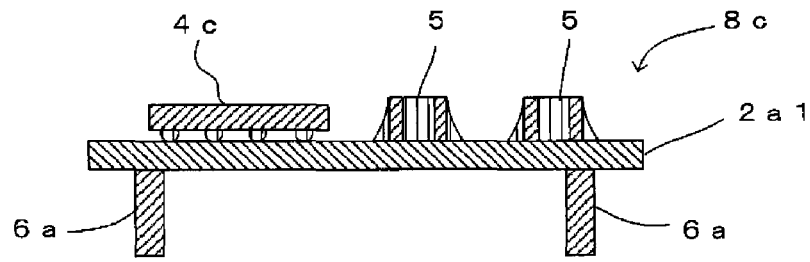
[FIGS. 4(a)-4(f)]

First, as shown in FIG. 4(a), one end portion of each of the plurality of first columnar conductors 6a is connected to one principal surface (lower principal surface) of the first substrate 2a1, and also, the IC 4c and the two chip components 5 are mounted on the other principal surface of the first substrate 2a1. As a result, a third member 8c including the first substrate 2a1, the first columnar conductors 6a, the IC 4c, and the two chip components 5 is prepared. In this case, the first columnar conductors 6a are arranged so as to enclose a predetermined region of the lower principal surface of the first substrate 2a1. As a result, an enclosed region for storing a fourth member 8d, which will be discussed below, therein is formed.

Figure 4B:
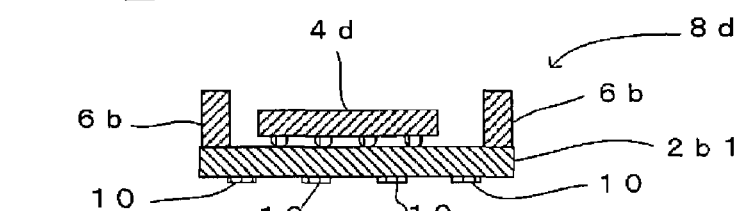

Then, as shown in FIG. 4(b), the IC 4d is mounted on one principal surface (upper principal surface) of the second substrate 2b1, the area of the principal surface of which is smaller than that of the first substrate 2a1. Then, the plurality of second columnar conductors 6b are arranged so as to enclose the IC 4d, and one end portion of each of the second columnar conductors 6b is connected to the upper principal surface of the second substrate 2b1. As a result, the fourth member 8d including the second substrate 2b1, the IC 4d, and the second columnar conductors 6b is prepared. On the other principal surface (lower principal substrate) of the second substrate 2b1, the external connection terminals 10 are formed in advance, for example, by a printing technology or by plating using a conductive paste made of, for example, Ag.

Figure 4C:
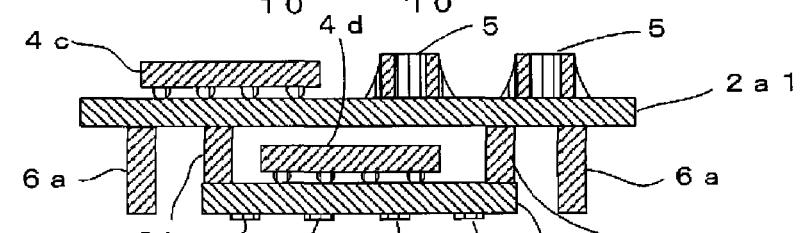

Then, as shown in FIG. 4(c), the fourth member 8d is disposed within the enclosed region formed by the first columnar conductors 6a of the third member 8c, and then, the other end portions of the second columnar conductors 6b are connected to the lower principal surface of the first substrate 2a1 of the third member 8c. By disposing the third member 8c and the fourth member 8d in this manner, a non-superposing region in which the first substrate 2a1 of the third member 8c is not superposed on the second substrate 2b1 of the fourth member 8d, as viewed from above, is formed in the first substrate 2a1. The first columnar conductors 6a are disposed at positions corresponding to this non-superposing region.

Figure 4D:
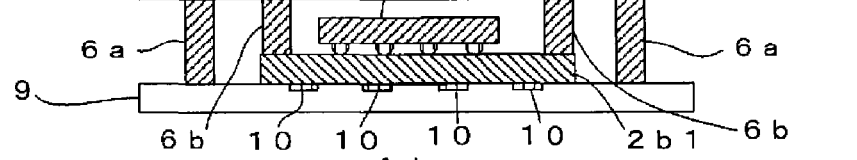

Then, as shown in FIG. 4(d), the other end portions of the first columnar conductors 6a of the third member 8c and the lower principal surface of the second substrate 2b1 of the fourth member 8d on which the connection terminals 10 are formed are bonded to one principal surface (upper principal surface) of a support member 9 to which an adhesive sheet (not shown), for example, is attached. In this manner, the third member 8c and the fourth member 8d are fixed onto the support member 9.

Figure 4E:
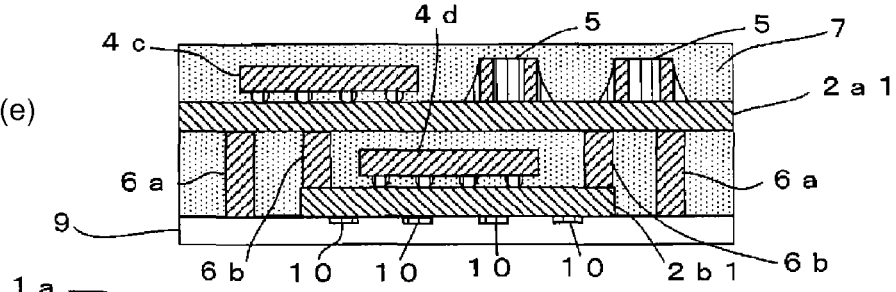

Then, as shown in FIG. 4(e), a resin 7 is charged so that the third member 8c and the fourth member 8d can be sealed, and is set at a temperature of about 180° C.

Figure 4F:
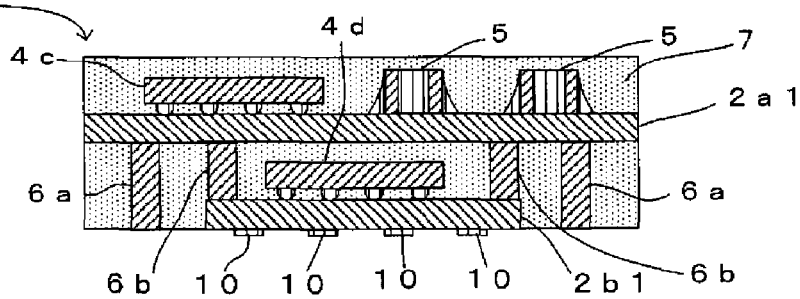

Finally, as shown in FIG. 4(f), by removing the support member 9, the multilayer electronic device 1a is manufactured. In this state, the other end portions of the first columnar conductors 6a and the lower principal surface of the second substrate 2b1 of the fourth member 8d are exposed to the outside from the surface of the resin 7.

In this embodiment, the other end portions of the first columnar conductors 6a and the lower principal surface of the substrate 2b1 of the second substrate layer 2b on which the connection terminals 10 are formed are exposed to the outside from the surface of the resin 7. Thus, the multilayer electronic device 1a can be connected to an external component by using both of the first columnar conductors 6a and the connection terminals 10. The connection terminals 10 formed on the substrate 2b1 of the second substrate layer 2b are not likely to be vulnerable to the influence of thermal expansion and contraction of the resin 7 (for example, the connection terminals 10 are displaced), thereby enhancing the reliability in connecting to an external component. The first columnar conductors 6a are disposed at positions corresponding to the non-superposing region of the substrate 2a1 of the first substrate layer 2a, so that they can be directly connected to an external component without the interposed substrate 2b1 of the second substrate layer 2b therebetween.

Accordingly, as in the first embodiment, it is possible to prevent the generation of the contact resistance with the substrate 2b1 of the second substrate layer 2b and to suppress an increase in stray inductance which would otherwise be caused by an increased extended path.

The other principal surface (lower principal surface) of the substrate 2b1 of the second substrate layer 2b is exposed to the outside from the surface of the resin 7. Accordingly, the dissipation of heat generated from, for example, the components 4c, 4d, and 5 of the multilayer electronic device 1a is enhanced.

The other end portions of the second columnar conductors 6b are connected to the substrate 2a1 of the first substrate 2a. Accordingly, the second columnar conductors 6b can be used as interlayer connecting conductors between the first substrate layer 2a and the second substrate layer 2b.

In the manufacturing method of the multilayer electronic device 1a discussed with reference to FIGS. 4(a)-4(f), by connecting the other end portions of the second columnar conductors 6b of the fourth member 8d to the lower principal surface of the first substrate 2a of the third member 8c, a non-superposing region can be formed in the first substrate 2a of the third member 8c. In the non-superposing region, the first substrate 2a of the third member 8c is not superposed on the second substrate 2b1 of the fourth member 8d, as viewed from above. Thus, the multilayer electronic device 1a having a designing-required space therein can be manufactured.

[Third Embodiment]

Figure 5:
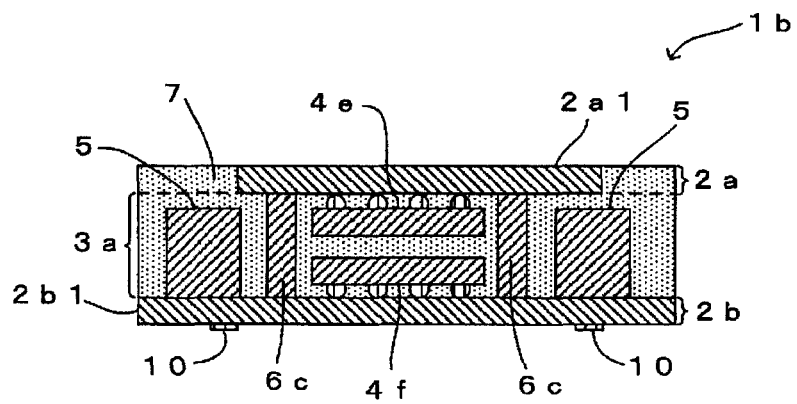
FIG. 5 is a sectional view of a multilayer electronic device according to a third embodiment of the present disclosure.
Figure 6:
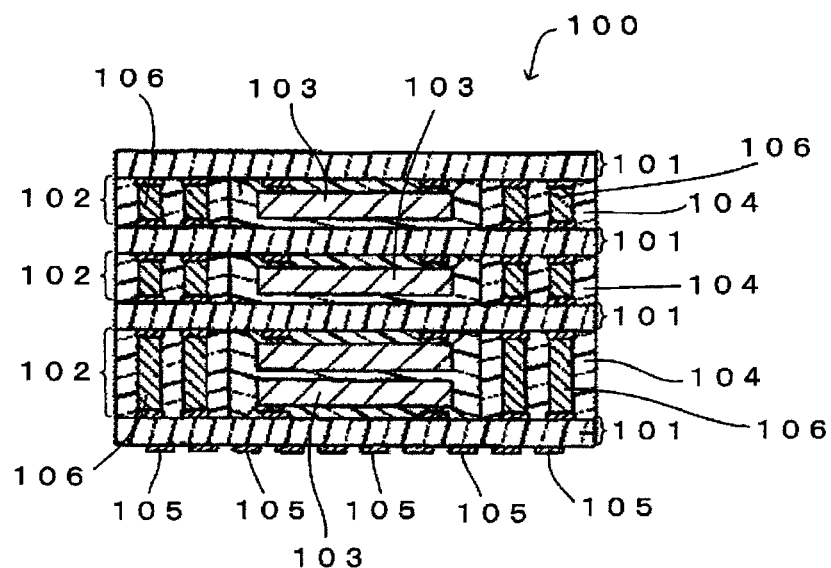
FIG. 6 is a sectional view of a known multilayer electronic device.

A multilayer electronic device 1b according to a third embodiment of the present disclosure will be described below with reference to FIG. 5. FIG. 5 is a sectional view of the multilayer electronic device 1b.

The multilayer electronic device 1b according to this embodiment is different from the multilayer electronic device 1 of the first embodiment discussed with reference to FIG. 1 in the following points. As shown in FIG. 5, the area of the substrate 2a1 of the first substrate layer 2a is smaller than that of the substrate 2b1 of the second substrate layer 2b, as viewed from above, and a non-superposing region in which the substrate 2b1 of the second substrate layer 2b is not superposed on the substrate 2a1 of the first substrate layer 2a, as viewed from above, is formed in the substrate 2b1. In both of the substrate 2a1 of the first substrate layer 2a and the substrate 2b1 of the second substrate layer 2b, the principal surfaces opposite the principal surfaces which are in contact with the first component layer 3a are exposed to the outside from the surface of the resin 7. The other configurations are the same as or correspond to those of the first embodiment. Accordingly, the same or corresponding configurations will be designated by like reference numerals, and an explanation thereof will thus be omitted.

A superposing region in which the substrate 2a1 of the first substrate layer 2a and the substrate 2b1 of the second substrate layer 2b are superposed on each other, as viewed from above, is formed. In the first component layer 3a at positions corresponding to this superposing region, an IC 4e mounted on the lower principal surface of the substrate 2a1 of the first substrate layer 2a and an IC 4f mounted on the upper principal surface of the substrate 2b1 of the second substrate layer 2b are disposed such that they oppose each other. A plurality of third columnar conductors 6c for connecting the substrate 2a1 of the first substrate layer 2a and the substrate 2b1 of the second substrate layer 2b are disposed so as to enclose the ICs 4e and 4f.

In both of the substrate 2a1 of the first substrate layer 2a and the substrate 2b1 of the second substrate layer 2b, the principal surfaces opposite the principal surfaces which are in contact with the first component layer 3a are exposed to the outside from the surface of the resin 7. External connection terminals 10 are formed on the exposed principal surface of the substrate 2b1 of the second substrate layer 2b.

In this manner, in the superposing region in which the substrate 2a1 of the first substrate layer 2a and the substrate 2b1 of the second substrate layer 2b are superposed on each other, the ICs 4e and 4f are mounted on the substrate 2a1 of the first substrate layer 2a and the substrate 2b1 of the second substrate layer 2b, respectively. It is thus possible to implement high-density mounting of the components 4e, 4f, and 5. The third columnar conductors 6c are arranged so as to enclose the ICs 4e and 4f. This is practical, particularly, in terms of enhancing the shielding characteristics for shielding the ICs 4e and 4f, which are vulnerable to the influence of unwanted electromagnetic waves entering from the outside. An external connection terminal may also be provided on the exposed principal surface of the substrate 2a1 of the first substrate layer 2a, so that the substrate 2a1 can be connected to an external component.

Another columnar conductor may be disposed in the first component layer 3a at a position corresponding to the non-superposing region of the substrate 2b1 of the second substrate layer 2b. One end portion of this columnar conductor may be connected to the upper principal surface of the substrate 2b1 of the second substrate layer 2b, and the other end portion thereof may be exposed to the outside from the surface of the resin 7. With this configuration, it is possible to directly connect this columnar conductor connected to the substrate 2b1 of the second substrate layer 2b to an external component without the interposed substrate 2a1 of the first substrate layer 2a therebetween.

The present disclosure is not restricted to the above-described embodiments, and various modifications other than those described above may also be made without departing from the spirit of the disclosure.

For example, in the above-described embodiments, the number of substrate layers 2a and 2b and the number of component layers 3a, 3b, and 3c forming the multilayer electronic devices 1, 1a, and 1b are not restricted to those described above. The multilayer electronic devices 1, 1a, and 1b may be formed by stacking more layers.

The substrates 2a1 and 2b1 disposed in the substrate layers 2a and 2b, respectively, may be multilayer substrates.

Industrial Applicability

The present disclosure may be used for various multilayer electronic devices formed by alternately stacking substrate layers in which substrates are disposed and component layers in which components are disposed.

1, 1a, 1b multilayer electronic device
2a first substrate layer (upper substrate layer)
2a1 substrate (substrate of upper substrate layer: first substrate)
2b second substrate layer (lower substrate layer)
2b1 substrate (substrate of lower substrate layer: second substrate)
3a first component layer (component layer)
3b second component layer (component layer)
3c third component layer (component layer)
4a to 4f IC (component)
5 chip component (component)
6a first columnar conductor (columnar conductor)
6b second columnar conductor (columnar conductor)
6c third columnar conductor (columnar conductor)
7 resin
8a first member
8b second member
8c third member
8d fourth member
10 connection terminal

The invention claimed is:

1. A multilayer electronic device formed by alternately stacking substrate layers and a component layer in a top-bottom direction, a substrate being disposed in each of the substrate layers and at least one component being disposed in the component layer,
   wherein a non-superposing region is formed in a substrate of an upper substrate layer, which is a substrate layer positioned on an upper side of the component layer, and/or a substrate of a lower substrate layer, which is a substrate layer positioned on a lower side of the component layer, and in the non-superposing region, the substrate of the upper substrate layer and the substrate of the lower substrate layer are not superposed on each other, as viewed from above, wherein:
   the component layer includes at least one of the components which is disposed at a position corresponding to the non-superposing region;
   a height of the at least one of the components in a stacking direction is greater than a distance between opposing principal surfaces of the substrate of the upper substrate layer and the substrate of the lower substrate layer; and
   wherein the at least one of the components which is disposed at a position corresponding to the non-superposing region is a nonsemiconductor component,
   wherein the component layer includes at least one of the components which is disposed at a position corresponding to a superposing region in which the substrate of the upper substrate layer and the substrate of the lower substrate layer are superposed on each other, as viewed from above, wherein:
   the at least one of the components disposed at a position corresponding to the superposing region is an IC;
   the IC is mounted on one of the substrate of the upper substrate layer and the substrate of the lower substrate layer; and
   a surface of the IC opposite to a mounting surface of the IC mounted on one of the substrate of the upper substrate layer and the substrate of the lower substrate layer is in contact with the other one of the substrate of the upper substrate layer and the substrate of the lower substrate layer,
   wherein the multilayer electronic device further comprises:
   a plurality of interlayer-connecting columnar conductors connected to one of the substrate of the upper substrate layer and the substrate of the lower substrate layer are further provided; and
   the plurality of interlayer-connecting columnar conductors are disposed so as to enclose the at least one component of the component layer, wherein:
   the substrate of the upper substrate layer, the substrate of the lower substrate layer, the at least one component, and the interlayer-connecting columnar conductors are sealed by a resin;
   the non-superposing region is formed in the substrate of one of the upper substrate layer and the lower substrate layer; and
   at least one of the plurality of interlayer-connecting columnar conductors is disposed at a position corresponding to the non-superposing region of the substrate of one of the upper substrate layer and the lower substrate layer, and one end portion of the at least one of the plurality of interlayer-connecting columnar conductors is connected to the substrate of one of the upper substrate layer and the lower substrate layer in which the non-superposing region is formed, while the other end portion of the at least one of the plurality of interlayer-connecting columnar conductors is exposed to the outside from a surface of the resin, wherein:

a principal surface of the substrate of the other one of the upper substrate layer and the lower substrate layer opposite to a principal surface of the substrate which opposes the substrate of one of the upper substrate layer and the lower substrate layer having the substrate in which the non-superposing region is formed is exposed to the outside from the surface of the resin; and an external connection terminal is provided on the exposed principal surface.

2. The multilayer electronic device according to claim 1, wherein an area of one of the substrate of the upper substrate layer and the substrate of the lower substrate layer is smaller than an area of the other one of the substrate of the upper substrate layer and the substrate of the lower substrate layer, as viewed from above.

3. A manufacturing method for a multilayer electronic device, comprising:

a first preparing step of preparing a first member including a first substrate and a plurality of first columnar conductors, one end portion of each of the plurality of first columnar conductors being connected to one of principal surfaces of the first substrate, the plurality of first columnar conductors being disposed so as to enclose a predetermined region of the principal surface of the first substrate to which one end portion of each of the plurality of first columnar conductors is connected;

a second preparing step of preparing a second member including a second substrate and a plurality of second columnar conductors, an area of a principal surface of the second substrate being smaller than an area of the principal surface of the first substrate, one end portion of each of the plurality of second columnar conductors being connected to one of principal surfaces of the second substrate, the plurality of second columnar conductors being disposed so as to enclose a component to be mounted on one of the principal surfaces of the second substrate;

a disposing step of disposing the second member within an enclosed region formed by the plurality of first columnar conductors; and a resin sealing step of sealing the first member and the second member with a resin, wherein in the disposing step, a non-superposing region is formed in a substrate of an upper substrate layer, which is a substrate layer positioned on an upper side of the component layer, and/or a substrate of a lower substrate layer, which is a substrate layer positioned on a lower side of the component layer, and in the non-superposing region, the substrate of the upper substrate layer and the substrate of the lower substrate layer are not superposed on each other, as viewed from above, wherein:

the component layer includes at least one of the components which is disposed at a position corresponding to the non-superposing region; and wherein the at least one of the components which is disposed at a position corresponding to the non-superposing region is a nonsemiconductor component, wherein the component layer includes at least one of the components which is disposed at a position corresponding to a superposing region in which the substrate of the upper substrate layer and the substrate of the lower substrate layer are superposed on each other, as viewed from above, wherein:

the at least one of the components disposed at a position corresponding to the superposing region is an IC.

4. The manufacturing method according to claim 3, wherein, in the disposing step, the second member is disposed such that the other principal surface of the second substrate opposes the principal surface of the first substrate to which one end portion of each of the plurality of first columnar conductors is connected.

5. The manufacturing method according to claim 3, wherein, in the disposing step, the second member is disposed such that the principal surface of the first substrate to which one end portion of each of the plurality of first columnar conductors is connected opposes the principal surface of the second substrate to which one end portion of each of the plurality of second columnar conductors is connected, and the other end portions of the plurality of second columnar conductors are connected to the principal surface of the first substrate to which one end portion of each of the plurality of first columnar conductors is connected.

* * * * *